(12) United States Patent
Baik

(10) Patent No.: US 11,477,922 B2
(45) Date of Patent: Oct. 18, 2022

(54) ELECTRONIC COMPONENT PACKAGE

(71) Applicant: LG INNOTEK CO., LTD., Seoul (KR)

(72) Inventor: Ji Hyeon Baik, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 821 days.

(21) Appl. No.: 16/322,465

(22) PCT Filed: Aug. 4, 2017

(86) PCT No.: PCT/KR2017/008427
§ 371 (c)(1),
(2) Date: Jan. 31, 2019

(87) PCT Pub. No.: WO2018/026229
PCT Pub. Date: Feb. 8, 2018

(65) Prior Publication Data
US 2021/0360835 A1    Nov. 18, 2021

(30) Foreign Application Priority Data

Aug. 5, 2016 (KR) .......................... 10-2016-0100081

(51) Int. Cl.
*H05K 7/20* (2006.01)
*H01L 23/427* (2006.01)

(52) U.S. Cl.
CPC ....... *H05K 7/20927* (2013.01); *H01L 23/427* (2013.01); *H05K 7/20254* (2013.01); *H05K 7/20509* (2013.01); *H05K 7/20872* (2013.01)

(58) Field of Classification Search
CPC .......... H05K 7/20254; H05K 7/20272; H05K 7/20872; H05K 7/20927
See application file for complete search history.

(56) References Cited

U.S. PATENT DOCUMENTS 3,592,260 A * 7/1971 Berger .................... F28F 13/06
165/121
4,884,168 A * 11/1989 August .............. H05K 7/20254
361/702

(Continued)

FOREIGN PATENT DOCUMENTS

JP    H 08-204079    8/1996
JP    H 09-280278    10/1997

(Continued)

OTHER PUBLICATIONS

International Search Report (with English Translation) and Written Opinion dated Sep. 29, 2017 issued in Application No. PCT/KR2017/008427.

(Continued)

*Primary Examiner* — Robert J Hoffberg
(74) *Attorney, Agent, or Firm* — KED & Associates LLP

(57) ABSTRACT

An embodiment discloses an electronic component package comprising: a housing including a flow path arranged on one surface thereof; and an inlet and an outlet arranged on the housing, wherein the flow path includes a first area connected with the inlet and a second area connected with the outlet, the first area includes a guide, and the guide includes an area of which the width gradually widens from the inlet.

6 Claims, 7 Drawing Sheets

(56) References Cited

U.S. PATENT DOCUMENTS

| | | | |
|---|---|---|---|
| 6,173,758 B1* | 1/2001 | Ward | H01L 23/3677 165/80.3 |
| 6,325,185 B1 | 12/2001 | Doi et al. | |
| 6,333,852 B1* | 12/2001 | Lin | F28F 3/02 361/697 |
| 6,648,062 B2* | 11/2003 | Fukazu | F28F 3/04 165/185 |
| 6,961,244 B2* | 11/2005 | Tsuchiya | H02M 3/00 361/699 |
| 7,417,857 B2* | 8/2008 | Rondier | H01L 23/473 165/104.33 |
| 7,876,563 B2* | 1/2011 | Shiba | H01L 23/473 361/699 |
| 8,159,823 B2* | 4/2012 | Murakami | F28F 3/12 361/716 |
| 8,339,785 B2* | 12/2012 | Chang | H05K 7/20927 361/699 |
| 8,342,276 B2* | 1/2013 | Murakami | B60L 58/40 180/65.31 |
| 8,964,389 B2* | 2/2015 | Nagao | H01L 23/473 361/699 |
| 9,657,997 B2* | 5/2017 | Fujita | H01L 23/473 |
| 9,844,165 B2* | 12/2017 | Sever | F28F 13/12 |
| 9,907,217 B2* | 2/2018 | Park | H05K 5/03 |
| 9,986,665 B2* | 5/2018 | Kosaka | H02M 7/537 |
| 10,925,181 B2* | 2/2021 | Kim | H05K 7/20327 |
| 11,251,694 B2* | 2/2022 | Kim | H05K 7/20927 |
| 11,304,336 B2* | 4/2022 | Kim | H02M 3/003 |
| 2002/0011327 A1 | 1/2002 | Fukazu et al. | |
| 2013/0220587 A1* | 8/2013 | Tamura | F28F 3/086 165/185 |
| 2014/0318742 A1* | 10/2014 | Houle | H05K 7/20263 165/80.4 |
| 2017/0234627 A1* | 8/2017 | Kobayashi | F28F 1/40 165/183 |

FOREIGN PATENT DOCUMENTS

| | | |
|---|---|---|
| JP | 2002-046482 | 2/2002 |
| JP | 2010-027963 | 2/2010 |
| JP | 2014-39022 | 2/2014 |
| KR | 10-1328322 | 11/2013 |
| KR | 10-2014-0011449 | 1/2014 |
| KR | 20180032975 A * | 4/2018 |

OTHER PUBLICATIONS

European Search Report dated Jul. 18, 2019 issued in Application No. 17837280.1.

* cited by examiner

ELECTRONIC COMPONENT PACKAGE

CROSS-REFERENCE TO RELATED PATENT APPLICATIONS

This application is a U.S. National Stage Application under 35 U.S.C. § 371 of PCT Application No. PCT/KR2017/008427, filed Aug. 4, 2017, which claims priority to Korean Patent Application No. 10-2016-0100081, filed Aug. 5, 2016, whose entire disclosures are hereby incorporated by reference.

TECHNICAL FIELD

The present invention relates to an electronic component package.

BACKGROUND ART

A hybrid vehicle (such as an electric vehicle) using a motor includes a motor control unit configured to control the motor and a direct current (DC)-to-DC converter.

The DC-to-DC converter is a device configured to transform a DC voltage, and convert a DC into an alternating current (AC) to transform a voltage, and rectify the AC to obtain a DC.

DC-to-DC converters generate heat during operation. Therefore, a cooling system is generally used to dissipate the heat from the DC-to-DC converter. However, there is a problem in that eddies or bubbles are generated in a process of circulating high-pressure cooling water or cooling water non-uniformly flows, thereby lowering cooling efficiency.

DISCLOSURE

Technical Problem

The present invention is directed to providing an electronic component package with improved cooling performance.

Objectives that have to be solved according to the embodiments are not limited to the above described objectives, and other objectives which are not described above will be clearly understood by those skilled in the art from the following specification.

Technical Solution

One aspect of the present invention provides an electronic component package including a housing including a flow path disposed on one surface thereof and an inlet and an outlet disposed in the housing, wherein the flow path includes a first region connected to the inlet and a second region connected to the outlet, the first region includes a guide, and the guide includes a region of which a width increases as a distance from the inlet to the guide increases.

The first region may include a first tapered portion connected to the inlet.

As a distance from the inlet to the first tapered portion increases, the first tapered portion may become bent so that a distance from the second region to the first tapered portion increases.

An inner sidewall of the first tapered portion may intersect a central axis of the inlet.

The guide may extend toward the second region.

The guide may include a first end portion which faces the inlet and a second end portion disposed opposite to the first end portion.

The guide may include a bent portion which connects the first end portion and the second end portion.

A width of the bent portion may be greater than that of each of the first end portion and the second end portion.

The second end portion may intersect a central axis of the inlet.

The electronic component package may further include a plurality of electronic components disposed on the other surface of the housing.

The electronic components may include at least one of a switch, a transformer, and a diode.

The electronic component package may further include a first cover which covers the other surface, and a second cover which covers the one surface.

The electronic component package may further include a plurality of radiation fins formed to protrude from the one surface, wherein the radiation fins may be disposed in a region which overlaps a region in which the electronic components are mounted.

Another aspect of the present invention provides an electronic component package including a housing which includes a flow path disposed on one surface thereof and an inlet and an outlet disposed in the housing, wherein the flow path includes a first region connected to the inlet and a second region connected to the outlet, the first region includes a first tapered portion connected to the inlet, and the first tapered portion become bent so that a distance from the second region to the first tapered portion increases as a distance from the inlet to the first tapered portion increases.

Advantageous Effects

According to an embodiment, cooling water can be controlled to improve cooling efficiency.

In addition, a problem of eddies and bubbles occurring in the cooling water can be reduced.

Various useful advantages and effects of the present invention are not limited to the above description, and can be more easily understood in a process of describing the specific embodiment of the present invention.

MODES OF THE INVENTION

Figure 1:
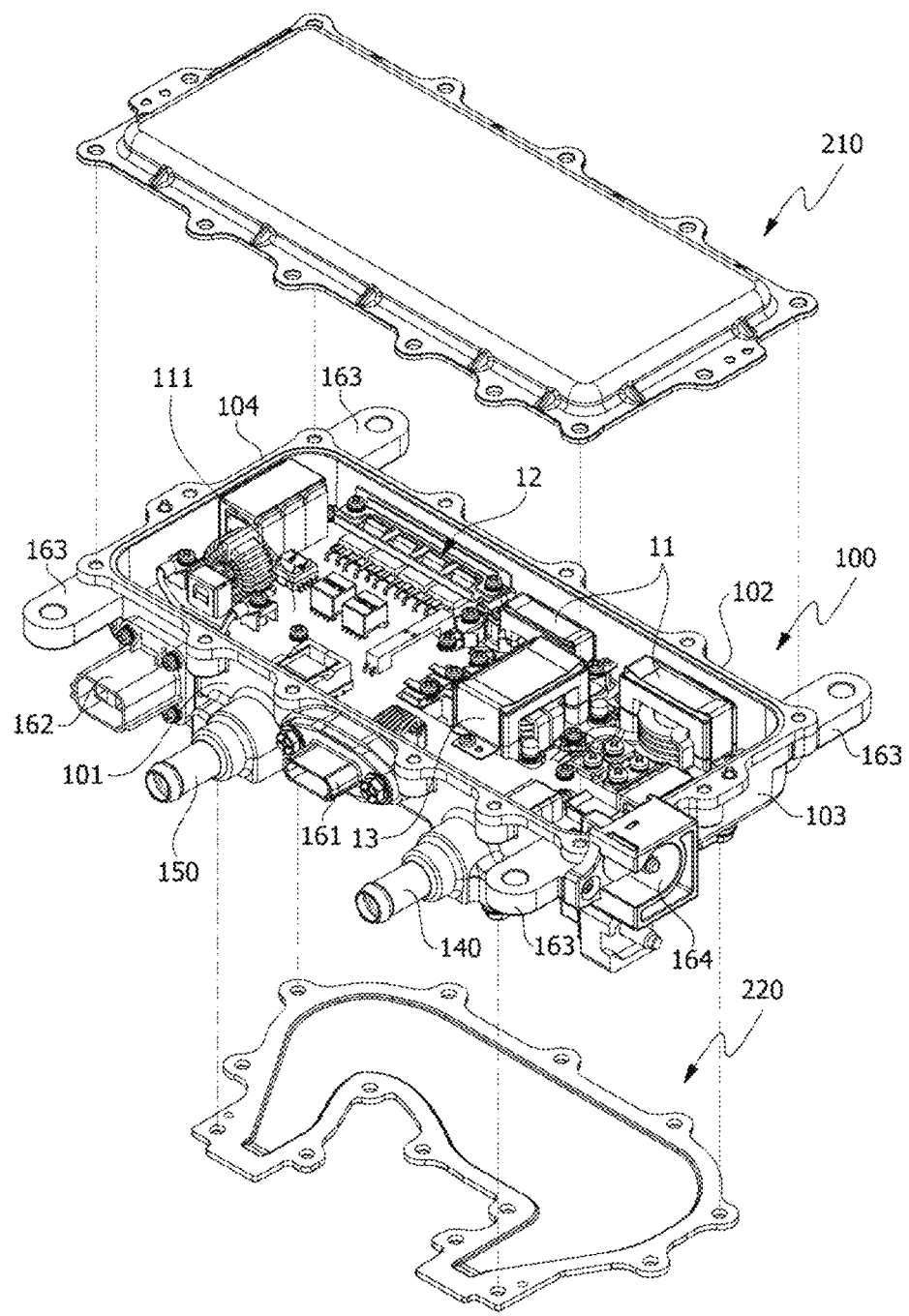
FIG. 1 is an exploded perspective view illustrating an electronic component package according to an embodiment of the present invention.

Since the invention allows for various changes and numerous embodiments, specific embodiments will be illustrated in the drawings and described in detail in the written description. However, this is not intended to limit the present invention to specific modes of practice, and it is to be appreciated that all changes, equivalents, and substitutes that do not depart from the spirit and technical scope of the present invention are encompassed in the present invention.

It will be understood that, although the terms "first," "second," etc. may be used herein to describe various elements, these elements should not be limited to these terms. These terms are only used to distinguish one element from another. For example, a first element could be termed a second element, and a second element could similarly be termed a first element without departing from the scope of the present invention. As used herein, the term "and/or" includes combinations or any one of a plurality of associated listed items.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements.

The terminology used herein is for the purpose of describing particular embodiments only and is not intended to be limiting to the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, components, and/or groups thereof but do not preclude the presence or addition of one or more other features, integers, steps, operations, elements, components, and/or groups thereof.

In a description of the embodiment, in a case in which any one element is described as being formed on (or under) another element, such a description includes both a case in which the two elements are formed to be in direct contact with each other and a case in which the two elements are in indirect contact with each other such that one or more other elements are interposed between the two elements. In addition, when one element is described as being formed on (or under) another element, such a description may include a case in which the one element is formed at an upper side or a lower side with respect to another element.

Example embodiments of the invention will be described below in more detail with reference to the accompanying drawings. Components that are the same or correspond to each other are rendered with the same reference numeral regardless of the figure number, and redundant descriptions thereof will be omitted.

Figure 2:
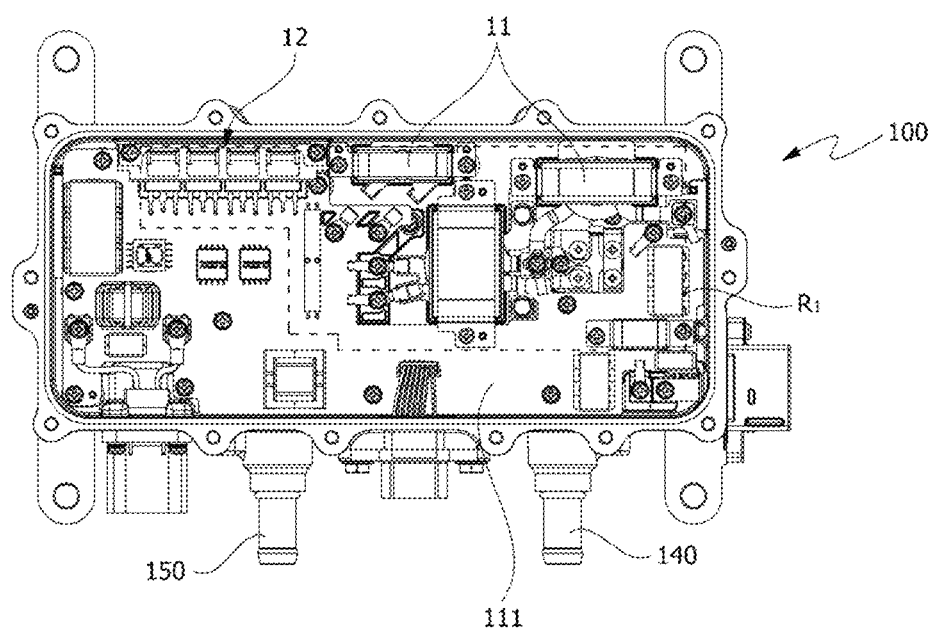
FIG. 2 is a plan view of FIG. 1.

FIG. 1 is an exploded perspective view illustrating an electronic component package according to an embodiment of the present invention, and FIG. 2 is a plan view of FIG. 1.

Referring to FIG. 1, the electronic component package includes a housing 100 having a flow path formed on one side 112 and a plurality of electronic components 11, 12, and 13 disposed on the other surface 111 of the housing 100, a first cover 210 which covers the other surface 111 of the housing 100, and a second cover 220 which covers one surface 112 of the housing 100.

A flow path through which cooling water for discharging heat generated by the plurality of electronic components 11, 12, 13 flows may be formed on one surface 112 of the housing 100. A space portion in which the plurality of components 11, 12, and 13 are disposed may be formed on the other surface 111 of the housing 100.

The first cover 210 may be coupled to the other surface 111 of the housing 100 to cover the plurality of electronic components 11, 12 and 13. The second cover 220 may be coupled to one surface 112 to seal the flow path. The second cover 220 may have a shape corresponding to a shape of the flow path. Thus, an area of the second cover 220 may be smaller than that of the first cover 210. The coupling method is exemplified by screw coupling but is not necessarily limited thereto.

The electronic component package may be a package which includes any package in which various electronic components are mounted. For example, the electronic component package may be a package in which various electronic components, such as a direct current (DC)-to-DC converter and an alternating current (AC)-to-DC converter, are integrated.

In a case in which the electronic component package is a DC-to-DC converter, the electronic component may include a switching unit 12, a transformer 13, a rectifier diode, and the like. These electronic components may generate more heat than other components. Referring to FIG. 2, an upper side of the electronic component package may be a relatively high temperature region R1 in the drawing.

Since the electronic components operate in operating temperature ranges thereof, it is important to quickly radiate the heat generated by the components. That is, temperature control of the package can have a significant impact on reliability of a product.

Particularly, in the case of an electric vehicle, since the converter converts a battery voltage level to various voltage levels which are used as power sources of components which operate at the various voltage levels, reliability of the converter is very important.

The housing 100 may have four side surfaces 101, 102, 103, and 104. The first side surface 101 and the second side surface 102 may be disposed opposite to each other, and the third side surface 103 and the fourth side surface 104 may be disposed opposite to each other. Here, the first side surface 101 may be longer than the third side surface 103.

An inlet 150 and an outlet 140 for cooling water may be disposed on the first side surface 101. The first connector 161 may be disposed between the inlet 150 and the outlet 140, and the second connector 162 may be disposed near a corner in which the first side surface 101 and the fourth side surface 104 meet. In addition, since protrusions 163 are disposed at corners in which the side surfaces 101, 102, 103, and 104 meet, the electronic component package can be fixed to a vehicle or the like. An air duct 164 configured to circulate air inside the housing may be disposed on the third side surface 103.

Figure 3:
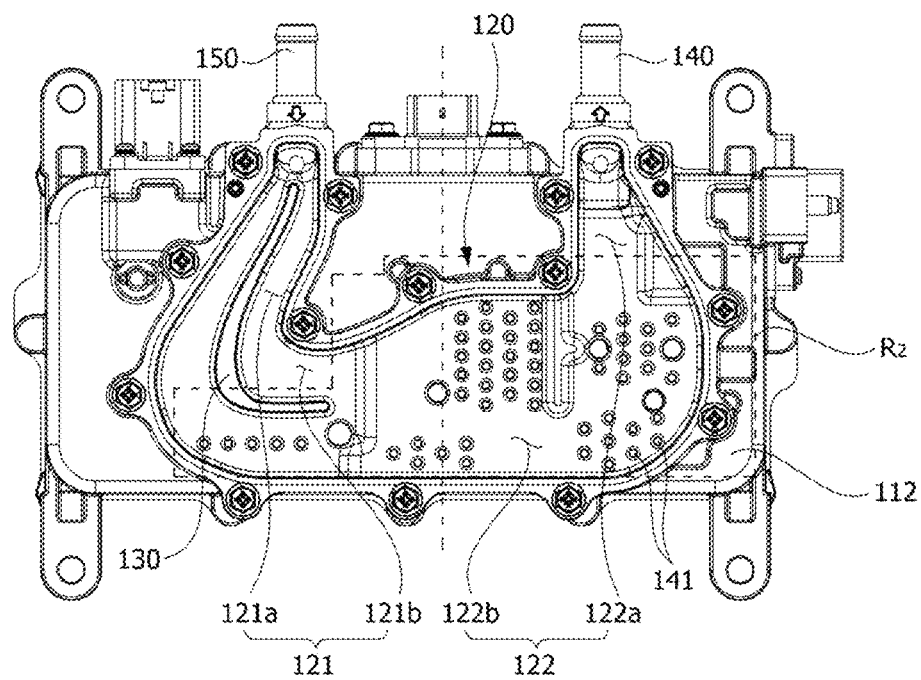
FIG. 3 is a bottom view of FIG. 1.
Figure 4:
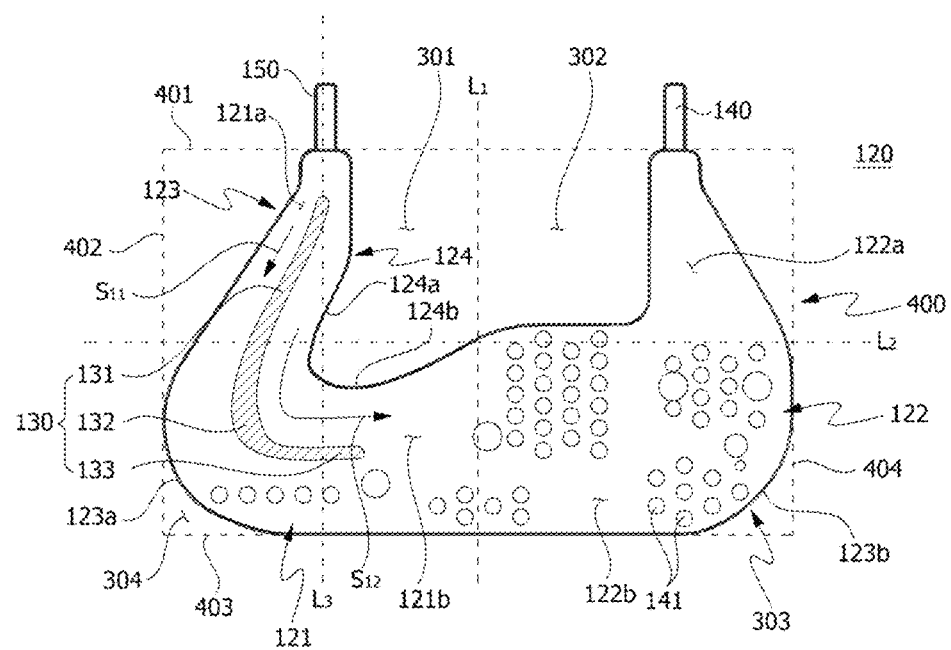
FIG. 4 is a view for describing a flow of cooling water introduced into a cooling panel.
Figure 5:
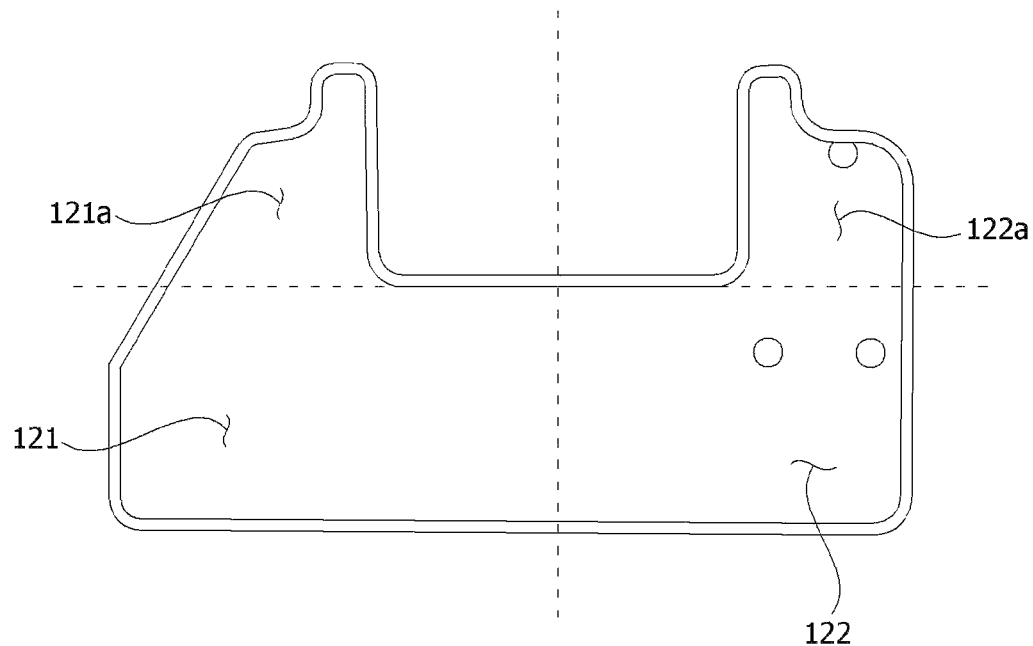
FIG. 5 is a view illustrating a first modified example of FIG. 4.
Figure 6:
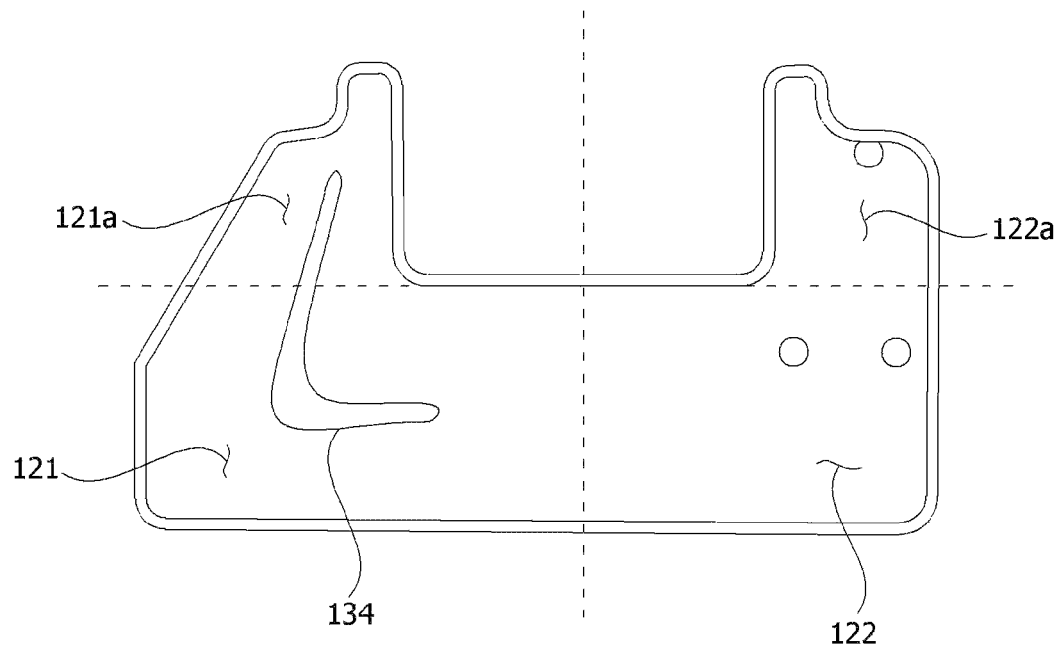
FIG. 6 is a view illustrating a second modified example of FIG. 4.

FIG. 3 is a bottom view of FIG. 1, FIG. 4 is a view for describing a flow of cooling water introduced into a cooling panel, FIG. 5 is a view illustrating a first modified example of FIG. 4, and FIG. 6 is a view illustrating a second modified example of FIG. 4.

Referring to FIG. 3, the flow path 120 may be formed on one surface 112 of the housing 100. The flow path 120 may include a first region 121 into which cooling water is introduced and a second region 122 through which the cooling water is discharged.

The first region 121 may be connected to the inlet 150 to receive the cooling water, and the second region 122 may be connected to the outlet 140 to discharge the cooling water. The inlet 150 and the outlet 140 may be disposed side by side on one side surface of the housing 100. Accordingly, the flow path 120 may have a U-shape. However, the inlet 150 and the outlet 140 may be disposed on different side surfaces of the housing 100.

The flow path 120 may be provided in a region R2 corresponding to a high temperature region of FIG. 2.

A plurality of radiation fins 141 may be disposed in a region in which components operating at a high temperature are disposed. A position and the number of the radiation fins 141 are not specifically limited. As an example, the number of radiation fins 141 may be increased in a region at which metal-oxide-semiconductor field effect transistors (MOSFETs) or transformers which generate relatively high heat are positioned. Some of the radiation fins 141 serve not only to lower temperatures of the components but also serve as a groove for coupling the components.

The first region 121 includes a first tapered portion 121a connected to the inlet 150. The first tapered portion 121a may become wider as a distance from the inlet 150 increases. The first tapered portion 121a may control a flow speed and/or a flow rate of introduced cooling water. The cooling water introduced through the first tapered portion 121a may cool the first region 121 and the second region 122. The cooling water passing through the first region 121 and the second region 122 may be discharged to the outside through the outlet 140.

Referring to FIG. 4, as a distance from the inlet to the first tapered portion 121a increases, the first tapered portion 121a may become bent so that a distance from the second region 122 to the first tapered portion 121a increases. Here, among sidewalls forming the first tapered portion 121a, a first sidewall 124 may intersect the central axis L3 of the inlet 150 at an intersection point 124a of the first sidewall 124. The first sidewall 124 may be an inner sidewall forming a closed loop of the flow path 120, and the second sidewall 123 may be an outer sidewall forming the closed loop of the flow path 120. Therefore, a length of the second sidewall 123 is longer than that of the first sidewall 124. According to the embodiment, since, as distances from the inlet 150 to the first sidewall 124 and the second sidewall 123 increase, the first sidewall 124 and the second sidewall 123 become bent so that distances from the second region 122 to the first sidewall 124 and the second sidewall 123 increase, a flow speed can be controlled while a width of a flow path is not excessively increased.

A flow direction of high-pressure cooling water introduced through the inlet 150 may be changed due to the first sidewall 124 of the first tapered portion 121a. An initial path of cooling water introduced through the inlet 150 may be substantially parallel to the central axis L3. However, the path of the cooling water is bent to an extent by which the first sidewall 124 of the first tapered portion 121a is bent.

A guide 130 may be disposed in the first region 121. The guide 130 may include a first end portion 131 and a second end portion 133, which are disposed opposite to each other, and a bent portion 132 which connects the first end portion 131 and the second end portion 133.

The first end portion 131 may be disposed to face the inlet 150. Accordingly, the cooling water introduced through the inlet 150 may be divided by the first end portion 131 of the guide 130. That is, the guide 130 may bisect the first tapered portion 121a to divide a moving path of the cooling water into two paths. Therefore, an eddy phenomenon can be reduced because a flow speed is lowered and a flow rate becomes uniform.

Since a width of the first tapered portion 121a becomes wider as a distance from the inlet 150 increases, the flow rate and flow speed can be controlled. A width of the first end portion 131 may be increased in proportion to the width of the first tapered portion 121a. According to this configuration, the width of the first tapered portion 121a can be bisected evenly. Therefore, by uniformly controlling the flow rate and flow speed, the eddy phenomenon can be suppressed, thereby improving cooling performance.

The bent portion 132 may be bent toward the second region 122 from the first end portion 131. The bent portion 132 may be rounded to correspond to a round region 123a of the second sidewall. The bent portion 132 may control the cooling water guided by the inner sidewall among the introduced cooling water to flow toward the second region 122. This configuration has an advantage in that a flow path of the cooling water can be widened and the flow speed and flow rate can be controlled without changing a distance between the inlet 150 and the outlet 140.

The second end portion 133 may intersect the central axis L3 of the inlet 150. That is, the second end portion 133 may protrude toward the second region 122 with respect to the central axis L3 of the inlet 150. When the second end portion 133 does not intersect the central axis L3 of the inlet 150, some amount of the cooling water which bumps the first sidewall 124a of the first tapered portion 121a may bump the sidewall so that eddies can occur.

The bent portion 132 may be wider than each of the first end portion 131 and the second end portion 133. Accordingly, a width of the guide 130 may be increased and decreased in an extending direction. When a width of the bent portion 132 is increased, the bent portion 132 can withstand a strong hydraulic pressure of the cooling water, and an amount of cooling water remaining in the bent portion 132 can decrease.

According to the embodiment, the introduced cooling water can be divided into two water flows due to the first end portion 131 of the guide 130. The first water flow S11 divided to the outer side moves to the second region 122 according to the round region 123a of the second sidewall 123. Therefore, occurrence of eddies can be suppressed.

In addition, the second water flow S12 divided to the inner side may be guided to an inner side surface of the guide 130 due to the first sidewall 124a and a direction of the second water flow S12 may be changed toward the second region 122 due to the guide 130. Therefore, the flow speed becomes uniform and occurrence of eddies can be suppressed.

In a case in which a tetragon 400 is assumed to have a minimum size which surrounds the flow path 120, the tetragon 400 may include four divided regions defined by a first virtual line L1 which bisects a first side surface 401 and a third side surface 403 and a second virtual line L2 which bisects a second side surface 402 and a fourth side surface 404.

The four divided regions may include a first divided region 301 defined by the first side surface 401 and the second side surface 402, a second divided region 302 defined by the first side surface 401 and the fourth side surface 404, a third divided region 303 defined by the fourth side surface 404 and the third side surface 403, and a fourth divided region 304 defined by the third side surface 403 and the second side surface 402.

Here, the first region 121 of the flow path 120 may be defined as a region disposed in the first divided region 301 and the fourth divided region 304, and the second region 122 of the flow path 120 may be defined as a region disposed in the second divided region 302 and the fourth third divided region 303. In addition, the first virtual line L1 may be an intermediate line between the inlet and the outlet.

The first tapered portion 121a of the first region 121 of the flow path 120 may be defined as a region positioned in the first divided region 301. The second tapered portion 122a positioned in the second divided region 302 may be defined as a region from which cooling water is discharged. The second tapered portion 122a may be formed to have a width which decreases as the second tapered portion 122a becomes closer to the outlet. The second tapered portion 122a may include a round region 123b.

Regions 121b and 122b respectively corresponding to the third divided region 303 and the fourth divided region 304 may be defined as main cooling regions. The main cooling regions 121b and 122b may be regions which overlap regions in which most of electronic components are disposed. As described above, since occurrence of eddies of the cooling water passing through the first tapered portion 121a is suppressed, cooling efficiency in the main cooling regions 121b and 122b can be improved.

The first divided region 301 can be divided into a first-first divided region and a first-second divided region by the central axis L3 of the inlet 150. In addition, the fourth divided region 304 may also be divided into a fourth-first divided region and a fourth-second divided region by the central axis L3 of the inlet. The first-first divided region may include the first side surface 401 and the second side surface 402, and the first-second divided region may include only the first side surface 401. In addition, the fourth-first divided region may include the second side surface 402 and the third side surface 403, and the fourth-second divided region may include only the third side surface 403.

Here, the first end portion 131 of the guide 130 may be disposed in the first-first divided region. The bent portion 132 may be disposed in the fourth-first divided region, and the second end portion 133 may be disposed in the fourth-second divided region. In addition, a portion 124b at which the first sidewall 124a is closest to the third side surface 403 may be disposed in the fourth-second divided region.

However, a shape of the flow path 120 is not necessarily limited thereto but may be variously modified. As an example, the guide 130 may be omitted as illustrated in FIG. 5, or a round shape of the outer side surface of the flow path 120 may be omitted.

Figure 7:
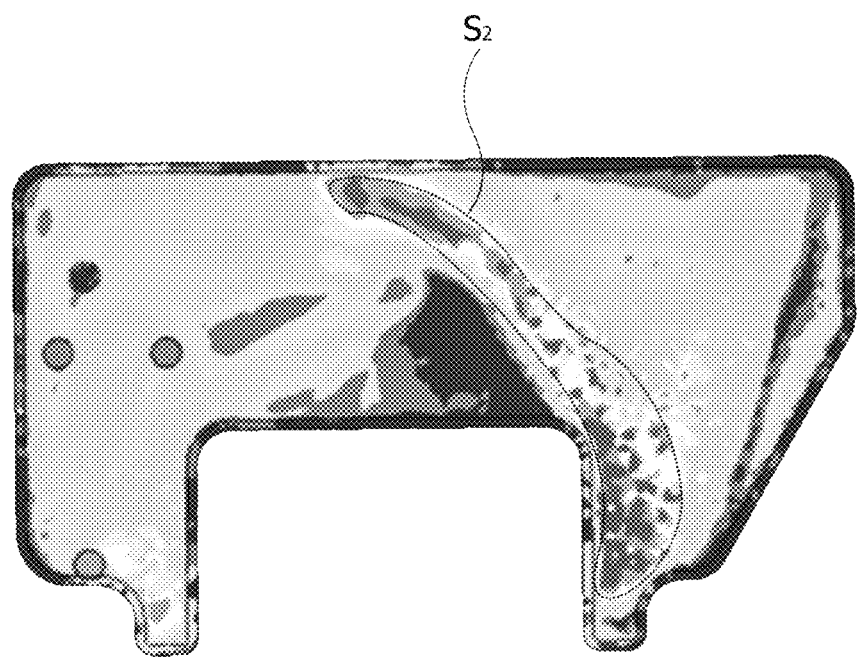
FIG. 7 is a view illustrating a simulation result of a cooling performance of the first modified example.
Figure 8:
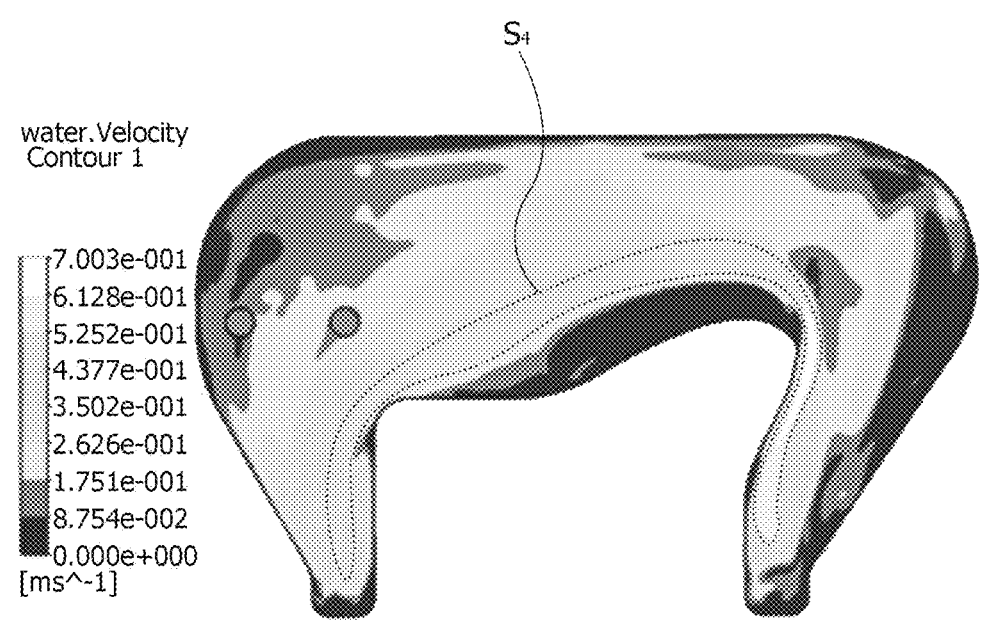
FIG. 8 is a view illustrating a simulation result of a cooling performance in a state in which there are no guides.
Figure 9:
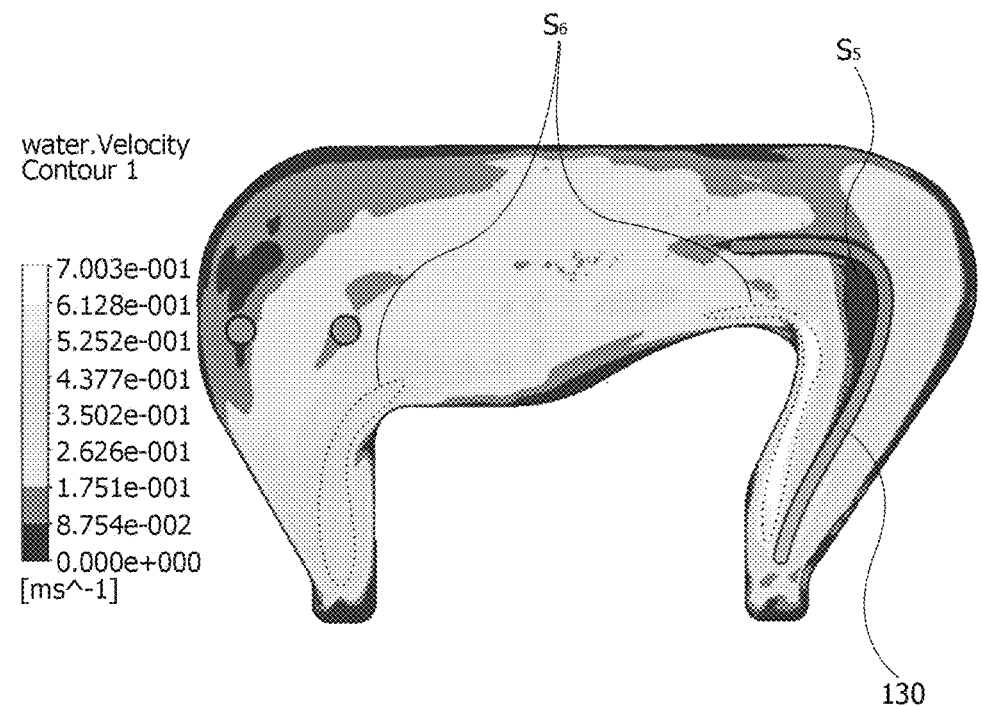
FIG. 9 is a view illustrating a simulation result of a cooling performance in a state in which a guide having no change in thickness is installed.
Figure 10:
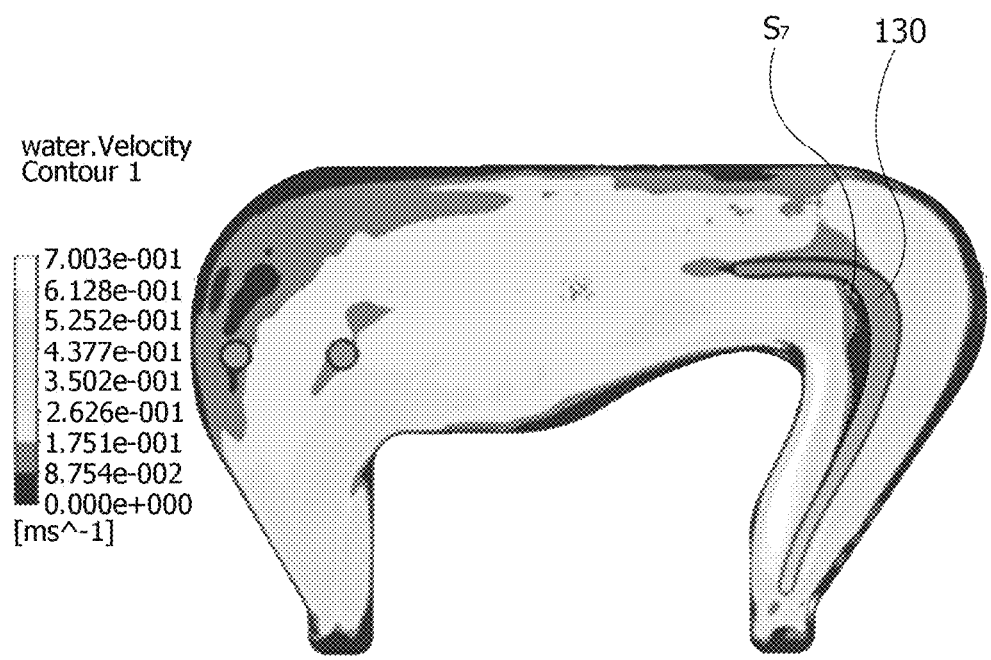
FIG. 10 is a view illustrating a simulation result of a cooling performance in a state in which a guide having a change in thickness is installed.

FIG. 7 is a view illustrating a simulation result of a cooling performance of the first modified example, FIG. 8 is a view illustrating a simulation result of a cooling performance in a state in which there are no guides, FIG. 9 is a view illustrating a simulation result of a cooling performance in a state in which a guide having no change in thickness is installed, and FIG. 10 is a view illustrating a simulation result of a cooling performance in a state in which a guide having a change in thickness is installed.

Referring to FIG. 7, when the first tapered portion was not bent and there were no guides, introduced cooling water bumped the outer sidewall S2 of the flow path 120 due to a strong pressure. Therefore, eddies occur and cooling performance was lowered.

Referring to FIG. 8, when the first tapered portion was bent and the outer side of the flow path was rounded, it can be seen that the cooling water pressure decreased as compared with FIG. 7. This may be attributed to the facts that the pressure decreased as a moving travel path of the cooling water was changed and the cooling water was guided along the rounded outer side.

However, in FIG. 8, although eddies did not directly occur in a region S4, there was a high probability of bubble generation due to a relatively low flow speed and various factors. Such an increase in bubbles lowered cooling performance.

Referring to FIG. 9, it can be seen that areas S6 decreased as compared with that of the region S4 in FIG. 8. Therefore, it can be seen that occurrence of eddies and bubbles was suppressed to improve cooling efficiency.

Referring to FIG. 10, it can be seen that an amount of water remaining in the guide 130 decreased. In the case of FIG. 9, since the width of the guide 130 was constant, a large amount of cooling water remained in a concave region S5 of the bent portion 132. However, as illustrated in FIG. 10, when the width of the guide 130 increased in the extending direction, it can be seen that the concave region of the bent portion 132 decreased to decrease an area S7 of the remaining water.

The invention claimed is:

1. An electronic component package comprising:
    a housing including a flow path disposed on one surface thereof; and
    an inlet and an outlet disposed in the housing,
    wherein the flow path includes a first region connected to the inlet and a second region connected to the outlet,
    wherein the first region includes a tapered portion connected to the inlet,
    wherein the first region includes a guide within the tapered portion,
    wherein the guide is a continuous structure that includes:
        a first end portion which faces the inlet;
        a second end portion disposed opposite to the first end portion; and
        a bent portion disposed between the first end portion and the second end portion of the continuous structure,
    wherein, as a distance from the inlet increases, the tapered portion becomes bent so that a distance from the second region to the tapered portion increases,
    wherein an inner sidewall of the tapered portion intersects a central axis of the inlet at an intersection point of the inner sidewall, the intersection point of the inner sidewall intersects another axis perpendicular to the central axis, and the another axis intersects the guide between the first end portion and the second end portion,
    wherein the central axis of the inlet intersects the second end portion of the guide,
    wherein a width of the bent portion of the guide is wider than a width of the first end portion of the guide, and the width of the bent portion of the guide is wider than a width of the second end portion of the guide,
    wherein the first end portion of the guide bisects the tapered portion in a width direction of the tapered portion, and,
    wherein a width of the tapered portion increases as a distance from the inlet increases.

2. The electronic component package of claim 1, wherein the guide extends toward the second region.

3. The electronic component package of claim 1, further comprising a plurality of electronic components disposed on another surface of the housing.

4. The electronic component package of claim 3, wherein the electronic components include at least one of a switch, a transformer, and a diode.

5. The electronic component package of claim 3, further comprising:
 a first cover which covers the another surface; and
 a second cover which covers the one surface.

6. The electronic component package of claim 3, further comprising a plurality of radiation fins formed to protrude from the another surface,
 wherein the radiation fins are disposed in a region which overlaps a region in which the electronic components are mounted.

\* \* \* \* \*